(12) United States Patent
Mizuno et al.

(10) Patent No.: US 7,894,036 B2
(45) Date of Patent: Feb. 22, 2011

(54) EXPOSURE APPARATUS

(75) Inventors: Makoto Mizuno, Utsunomiya (JP); Hiroshi Ito, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 1046 days.

(21) Appl. No.: 11/537,071

(22) Filed: Sep. 29, 2006

(65) Prior Publication Data
US 2007/0070317 A1   Mar. 29, 2007

(30) Foreign Application Priority Data
Sep. 29, 2005   (JP) .............................. 2005-284441

(51) Int. Cl.
*G03B 27/52*   (2006.01)
(52) U.S. Cl. .......................... 355/30; 355/53
(58) Field of Classification Search ............ 355/30, 355/53, 72
See application file for complete search history.

(56) References Cited

U.S. PATENT DOCUMENTS 6,952,253 B2   10/2005   Lof et al.
2004/0263809 A1*   12/2004   Nakano .................... 355/30
2005/0018155 A1*   1/2005   Cox et al. ................. 355/30
2005/0030498 A1*   2/2005   Mulkens ................... 355/30
2005/0259234 A1*   11/2005   Hirukawa et al. ......... 355/53
2006/0119809 A1*   6/2006   Verhagen et al. .......... 355/30
2006/0250593 A1*   11/2006   Nishii ....................... 355/53
2007/0296939 A1*   12/2007   Nishii ....................... 355/53

FOREIGN PATENT DOCUMENTS

JP   2004-289126   10/2002
WO   99/49504      9/1999

* cited by examiner

*Primary Examiner*—Hung Henry Nguyen
*Assistant Examiner*—Steven H Whitesell-Gordon
(74) *Attorney, Agent, or Firm*—Rossi, Kimms & McDowell LLP

(57) ABSTRACT

An exposure apparatus includes a projection optical system for projecting a pattern of a reticle onto a substrate to be exposed, via a liquid that is filled in a space between the substrate and a final lens that is closest to the substrate, a movement restricting part for restricting a movement of the liquid by forming a interval between the movement restricting part and the substrate, the interval is smaller than a interval of the space, and a moving part for moving the movement restricting part so that the interval between the movement restricting part and the substrate increases.

9 Claims, 9 Drawing Sheets

EXPOSURE APPARATUS

BACKGROUND OF THE INVENTION

The present invention relates generally to an exposure apparatus, and more particularly to a so-called immersion exposure apparatus that fills a space between a final lens (final surface) in a projection optical system and a substrate to be exposed with a liquid and exposes the substrate via the projection optical system and the liquid.

A projection exposure apparatus has been conventionally been used to transfer a circuit pattern on a reticle (or a mask) via a projection optical system onto a wafer etc, and an exposure apparatus with a high resolution and a high throughput has recently been increasingly demanded. The immersion exposure attracted people's attentions as one means that satisfies this demand. The immersion exposure promotes a higher numerical aperture ("NA") of the projection optical system by replacing, with a liquid, a medium between the wafer and the projection optical system. The projection optical system has an NA=n·sin θ where n is a refractive index of the medium, and the NA increases up to n when the filled medium has a refractive index greater than that of air, i.e., n>1. The immersion exposure intends to reduce the resolution R ($R=k_1(\lambda/NA)$) of the exposure apparatus, where $k_1$ is a process constant and λ is a wavelength of a light source.

A local fill method is proposed for the immersion exposure, which locally fills the liquid in the space between the final lens in the projection optical system and a wafer surface. See, for example, PCT International Publication No. 99/49504. However, it is difficult to fill the narrow space with the liquid, and when the wafer moves at a high speed, the filled liquid disperses. As a result, the filled liquid amount decreases, and air bubbles are mixed in the liquid and cause a diffuse reflection of the exposure light. The diffuse reflection of the exposure light decrease an exposure dose and lower a throughput. One proposed solution for this problem is an air curtain method that sprays a gas around the liquid and maintains the liquid in the narrow space. See, for example, Japanese Patent Application, Publication No. 2004-289126.

However, in the air curtain method, a power of maintaining the liquid to the space is weak if a gas pressure is low, and the liquid is dispersed from the space if the gas pressure is high. Therefore, a control of maintenance of the liquid by using only the air curtain is difficult.

BRIEF SUMMARY OF THE INVENTION

Accordingly, the present invention is directed to an exposure apparatus that can achieve a high resolution.

An exposure apparatus of one aspect of the present invention includes a projection optical system for projecting a pattern of a reticle onto a substrate to be exposed, via a liquid that is filled in a space between the substrate and a final lens that is closest to the substrate, a movement restricting part for restricting a movement of the liquid by forming a interval between the movement restricting part and the substrate, the interval is smaller than a interval of the space, and a moving part for moving the movement restricting part so that the interval between the movement restricting part and the substrate increases.

A device fabricating method according to another aspect of the present invention includes the steps of exposing a substrate to be exposed using the above exposure apparatus, and performing a development process for the substrate exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
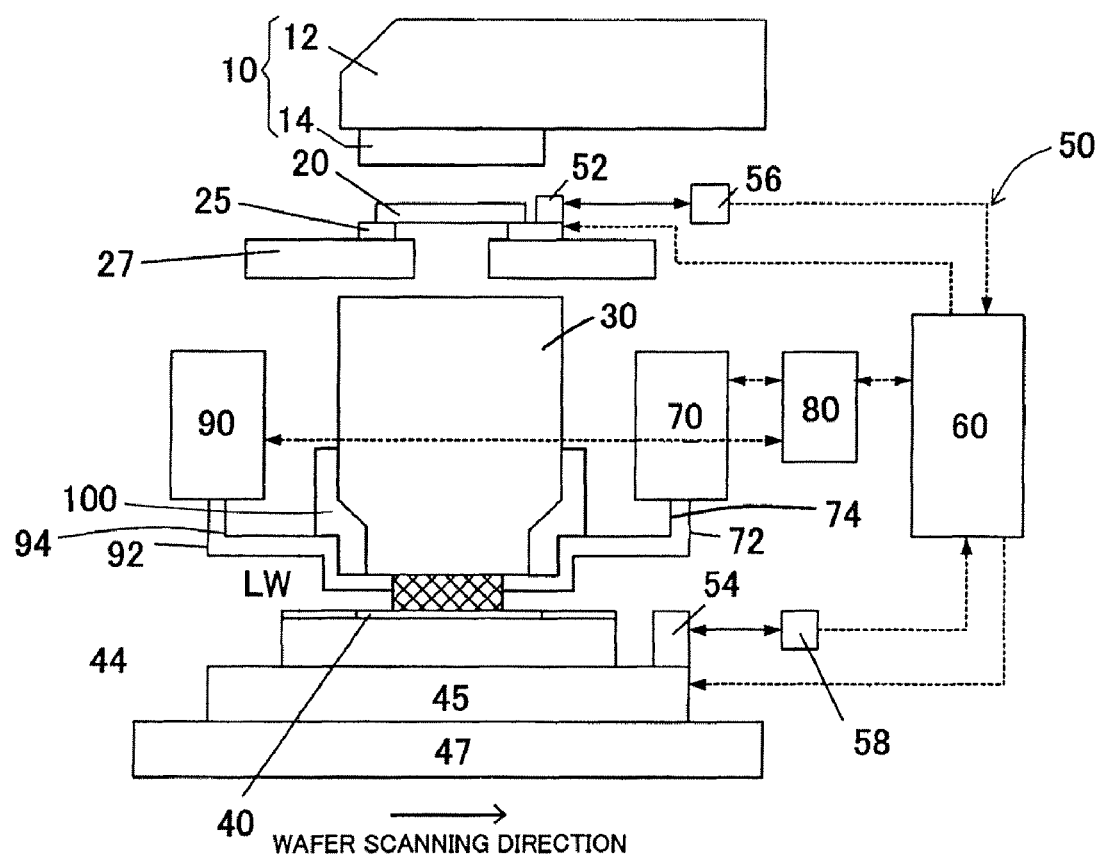
FIG. 1 is a schematic block diagram of an exposure apparatus of one aspect according to the present invention.

With reference to the accompanying drawings, a description will be given of an exposure apparatus 1 of one aspect according to the present invention. Here, FIG. 1 is a schematic block diagram of the exposure apparatus 1. The exposure apparatus 1 is an immersion exposure apparatus that exposes a pattern of a reticle (or a mask) onto a substrate 40, via a liquid LW supplied to a space between a final lens (final surface) that is closest to the substrate 40 in a projection optical system 30 and the substrate 40. The exposure apparatus 1 is an exposure apparatus that uses a step-and-scan manner (which is also called "a scanner") in the instant embodiment, and the present invention is also applicable to an exposure apparatus that uses a step-and-repeat manner (which is also called "a stepper").

The exposure apparatus 1 includes an illumination apparatus 10, a reticle stage 25, the projection optical system 30, a distance-measuring unit 50, a stage controller 60, a medium supply part 70, an immersion controller 80, a medium recovery part 90, a nozzle unit 100, and a moving mechanism 110.

The illumination apparatus 10 illuminates a reticle 20 that has a circuit pattern to be transferred, and includes a light source unit 12, and an illumination optical system 14.

The light source unit 12 uses, as a light source, an ArF excimer laser with a wavelength of approximately 193 nm in the instant embodiment. However, the light source is not limited to the ArF excimer laser and may use, for example, a KrF excimer laser with a wavelength of approximately 248 nm or $F_2$ laser with a wavelength of approximately 157 nm.

The illumination optical system 14 is an optical system that illuminates the reticle 20.

The reticle 20 is fed from the outside of the exposure apparatus 1 by a reticle feed system (not shown), and is supported and driven by the reticle stage 25. The reticle 20 is made, for example, of quartz, and has the circuit pattern to be transferred. The diffracted light from the reticle 20 passes the projection optical system 30, and is projected onto the substrate 40. The reticle 20 and the substrate 40 are located in an optically conjugate relationship. Since the exposure apparatus 100 is a scanner, the reticle 20 and the substrate 40 are scanned at a speed ratio of a reduction ratio of the projection optical system 30, thus transferring the pattern on the reticle 20 to the substrate 40. While this embodiment uses the stepper, the reticle 20 and the substrate 40 are maintained stationary during exposure.

The reticle stage 25 is fixed to a stool 27. The reticle stage 25 supports the reticle 20 via a reticle chuck (not shown), and its movement is controlled by a moving mechanism (not shown) and the stage controller 60. The moving mechanism (not shown) includes a linear motor, etc., drives the reticle stage 25 to move the reticle 20 in a scanning direction (in the instant embodiment, X-axis direction).

The projection optical system 30 images the pattern of the reticle 20 onto the substrate 40. The projection optical system 30 may use a dioptric optical system or a catoptric optical system. The projection optical system 30 is accommodated by the lens barrel.

The substrate 40 is fed from the outside of the exposure apparatus 1 by a substrate feed system (not shown), and is supported and driven by the substrate stage 45. The substrate 40 is a substrate to be exposed, and broadly covers a wafer and a glass plate. A photoresist is applied onto the substrate 40.

A level plate (support plate) 44 is a board that levels between the surface of the substrate 40 supported by the substrate stage 45 and the outside area of the substrate 40, and is level with the substrate 40. The level plate 44 is used for the immersion exposure, and enables the liquid LW to be supported (or to form a liquid film) at the edges of the substrate 40.

The substrate stage 45 is fixed to a stool 47, and supports the substrate 40 via a substrate chuck (not shown). The substrate stage 45 adjusts a position in the longitudinal (vertical or Z-axis) direction, a rotational direction and an inclination of the substrate 40 under control of the stage controller 60. During exposure, the stage controller 60 controls the substrate stage 45 so that the surface of the substrate 40 accords with a focal surface of the projection optical system 30 with high precision.

The distance-measuring unit 50 measures a two-dimensional position of the reticle stage 25 and the substrate stage 45 on real-time basis, via reference mirrors 52 and 54, and laser interferometers 56 and 58. A distance measurement result by the distance-measuring unit 50 is transmitted to the stage controller 60, and the reticle stage 25 and the substrate stage 45 are driven at a constant speed ratio under control of the stage controller 60 for positioning and synchronous control.

The stage controller 60 controls driving of the reticle stage 25 and the substrate stage 45.

The medium supply part 70 supplies the liquid LW and forms an air curtain to maintain the liquid LW in the space between the projection optical system 30 and the substrate 40. The medium supply part 70 includes a tank (not shown), a gas compressor (not shown), a flow rate controller (not shown), a deaerator (not shown), a generator (not shown), a temperature controller (not shown), a liquid supply pipe 72, and a gas supply pipe 74. Preferably, the liquid LW is selected from a material with a little absorption of the exposure light, and has almost same refractive index as a dioptric optical element such as quartz and the calcium fluorides. More specifically, the liquid LW can use pure water, function water, liquid fluorides (for example, fluorocarbon), etc.

The tank stores the liquid LW and a gas PG. The gas compressor feeds out the liquid LW and the gas PG. The flow rate controller controls a supply flow rate of the liquid LW and the gas PG. The deaerator degasify the liquid LW to sufficiently remove dissolved gas. The deaerator suppresses generations of air bubbles, and allows any generated air bubble to be absorbed in the liquid immediately. For example, the deaerator may target nitrogen and oxygen contained in the air. A removal of 80% of a gas amount dissolvable in the liquid LW would sufficiently suppress the generations of the air bubbles. The deaerator may always remove the dissolved gas from the liquid LW. The deaerator includes, for example, a membrane module and a vacuum pump. For example, the deaerator flows the liquid LW from one side of a gas transmitting membrane, and maintains the other side in vacuum, expelling the dissolved gas from the liquid LW through the membrane. The generator reduces contaminants, such as metal ions, fine particles, and organic matters, from a material supplied from the tank, and generates the liquid LW. The liquid LW generated by the generator is supplied to the deaerator. The temperature controller controls the temperature of the liquid LW to a predetermined temperature.

Figure 2:
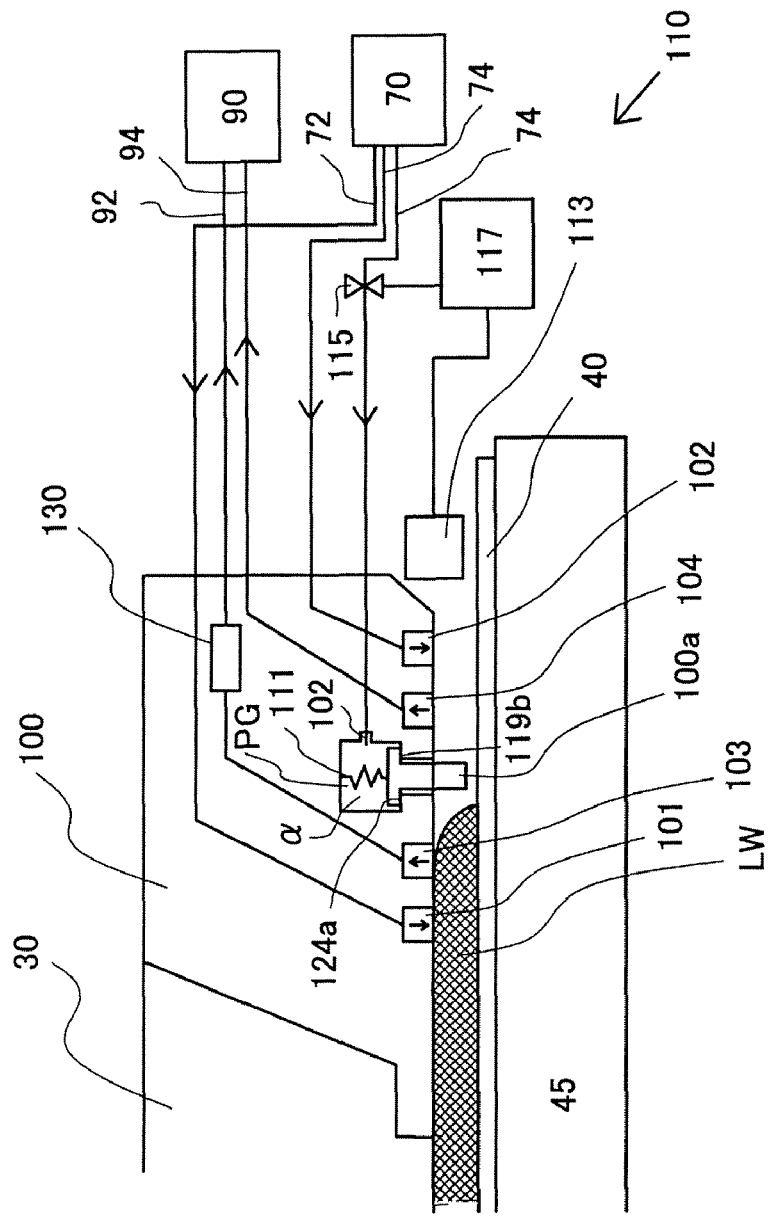
FIG. 2 is a schematic enlarged sectional view of near a projection optical system and a substrate of the exposure apparatus shown in FIG. 1.

The liquid supply pipe 72 is arranged around the final lens in the projection optical system 30, and is connected to a liquid supply port 101 in the nozzle unit 100 described later, as shown in FIG. 2. Thereby, the liquid supply pipe 72 supplies the liquid LW to the space between the projection optical system 30 and the substrate 40, and forms the liquid film of the liquid LW. The space between the projection optical system 30 and the substrate 40 preferably has a distance, for example, of 1.0 mm, enough to stably form the liquid film of the liquid LW. Here, FIG. 2 is a schematic enlarged sectional view of near the projection optical system 30 and the substrate 40.

The liquid supply pipe 72 is preferably made of resin that is less likely to liquate or contaminate the liquid LW, such as Teflon resin, polyethylene resin, and polypropylene resin. When the liquid LW uses liquid other than pure water, the liquid supply pipe 72 may be made of a material that is less likely to liquate out and has sufficient durability to the liquid LW.

The gas supply pipe 74 is connected to a gas supply port 102 in the nozzle unit 100 as shown in FIG. 2, and supplies the gas PG to a surround of the space between the final lens in the projection optical system 30 and the substrate 40. As a result, the air curtain to maintain the liquid in the space is formed, protects an environment of the outside of the space from the liquid LW and prevents a contact between an air of the outside of the space and the liquid LW. The gas supply pipe 74 is made of various types of resin and metal, such as stainless steel. An electromagnetic valve 115 that controls a flow rate of the gas PG is attached to the gas supply pipe 74.

The gas PG may use hydrogen and inert gas, such as nitrogen, helium, neon, and argon. The gas PG maintains the liquid LW in the space and shields oxygen that negatively affects exposure from the liquid LW. Even if hydrogen and inert gas dissolve in the liquid LW, the influence on the exposure, such as a change of refractive index, is small, and a deterioration of a transferring precision is small.

The immersion controller 80 obtains information of the substrate stage 45, such as a current position, speed, acceleration, a target position, and moving direction. The immersion controller 80 controls a switch between supplying and recovering of the liquid LW, a supply stop of the liquid LW, a recovery stop of the liquid LW, and amounts of the supplied or recovered liquid LW based on the information. The immersion controller 80 provides the medium supply part 70 and the medium recovery part 90 with control commands.

The medium recovery part 90 recovers the liquid LW and the gas PG that have been supplied by the medium supply part 70. The medium recovery part 90 includes, in the instant embodiment, a liquid recovery pipe 92 and a gas recovery pipe 94. The medium recovery part 90 further includes a tank that temporarily stores the recovered liquid LW and the gas PG, an absorber that absorbs the liquid LW and the gas PG, and a flow rate controller that controls a recovery flow rate of the liquid LW and the gas PG.

The liquid recovery pipe 92 mainly recovers the supplied liquid LW from a liquid recovery port 103 in the nozzle unit 100. The liquid recovery pipe 92 is preferably made of resin that is less likely to liquate out or contaminate the liquid LW, such as Teflon resin, polyethylene resin, and polypropylene resin. When the liquid LW uses liquid other than pure water, the liquid recovery pipe 92 may be made of a material that is less likely to liquate out and has sufficient durability to the liquid LW.

The liquid recovery pipe 92 may includes a buffer layer 130 so that a recovery speed by the liquid recovery port 103 becomes uniform. The buffer layer 130 recovers both of the gas PG and the liquid LW, and generates vibration. Therefore, the buffer layer 130 is preferably provided to a position except the nozzle unit 100.

The gas recovery pipe 94 is connected to a gas recovery port 104 in the nozzle unit 100, recovers the supplied gas PG, and may recover a part of the liquid LW. The gas recovery pipe 94 is made of various types of resin and metal, such as stainless steel.

Figure 3:
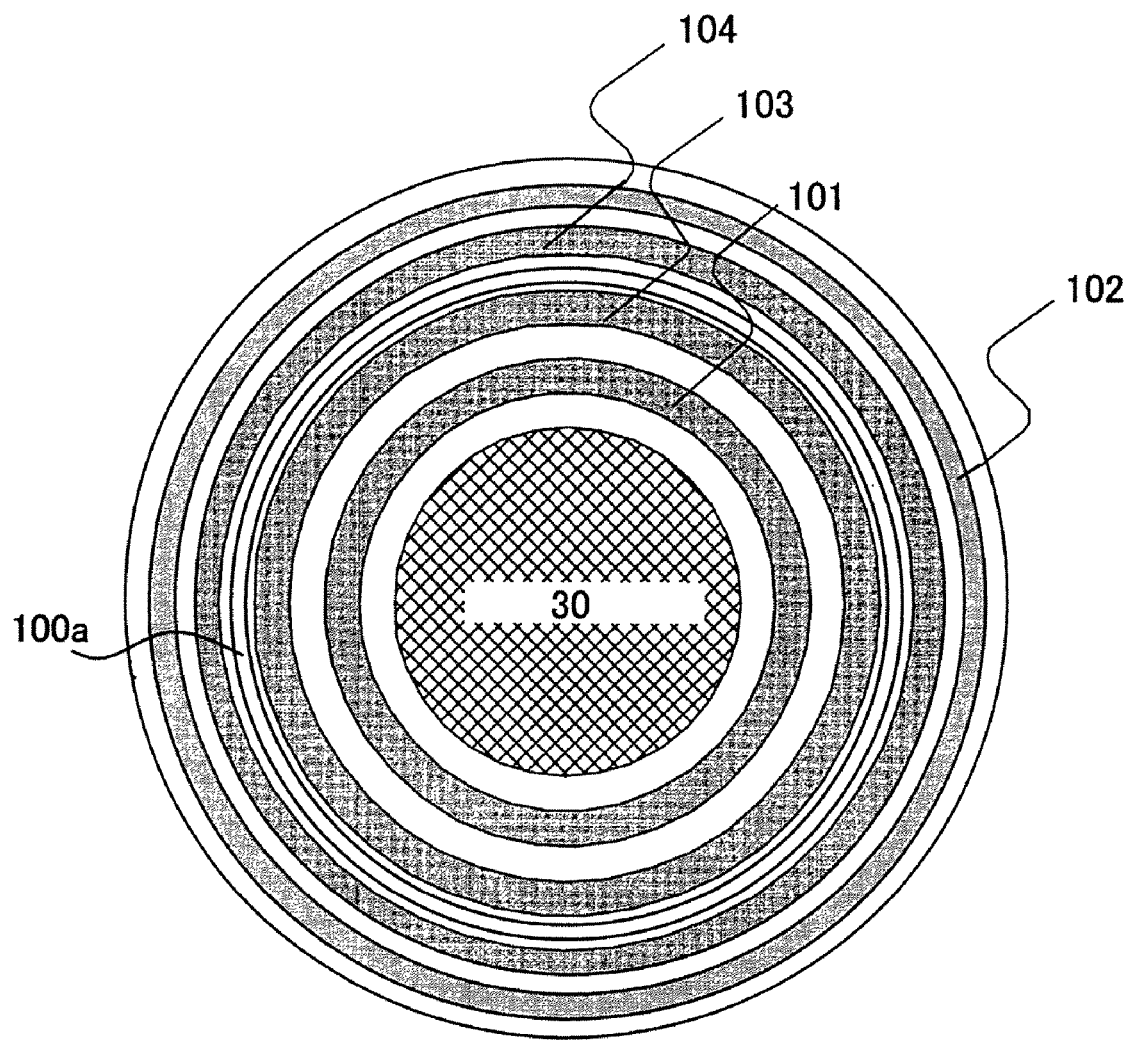
FIG. 3 is a schematic bottom view of a nozzle unit of the exposure apparatus shown in FIG. 1.

The nozzle unit 100 serves to hold the final lens of the projection optical system 30, and includes, as shown in FIG. 2, the liquid supply port 101, the gas supply port 102, the liquid recovery port 103, the gas recovery port 104 and a convex part 100a. The supply ports 101 and 102 and the recovery ports 103 and 104 are, respectively, an opening that has a shape inserted by two concentric circles as shown in FIG. 3, and may be coupled with a porous member, such as a sponge, or may be a cavity. Here, FIG. 3 is a schematic bottom view of the nozzle unit 100. The supply ports 101 and 102 and the recovery ports 103 and 104 are not limited to the shape inserted by two concentric circles, and may have a shape inserted by two similar polygon or another shape.

The openings 101 to 104 is arranged the opening 101, the opening 103, the opening 104 and the opening 102 in this order, from a center to a radial direction.

The liquid supply port 101 is connected to the liquid supply pipe 72 and is the opening to supply the liquid LW. Therefore, the liquid supply port 101 is arranged so that the liquid supply port 101 is closest to the projection optical system 30 among the openings 101 to 104. The liquid recovery port 103 is connected to the liquid recovery pipe 92 and is the opening to recovery the supplied liquid LW. Therefore, the liquid recovery port 103 is arranged the near outside of the liquid supply port 101.

On the other hand, the gas supply port 102 is connected to the gas supply pipe 74 and is the opening to supply the gas PG. In other words, the gas supply port 102 is the opening to form the air curtain. Therefore, the gas supply port 102 is arranged most outside (convex part 100a described later) among the openings 101 to 104 in the instant embodiment. The gas recovery port 104 is the opening to recovery the supplied gas PG, and is connected to the gas recovery pipe 94. Therefore, the gas recovery port 102 is arranged near the gas supply port 102. The gas PG flows the inside from the outside by arranging the gas recovery port 104 inside the gas supply port 102.

The convex part 100a projects in a substrate direction rather than the final lens in the projection optical system, and forms an interval smaller than an interval between the final lens and the substrate 40. Thereby, the convex part 100a restricts a movement of the liquid LW, and achieves a maintenance effect of the liquid LW with the air curtain. The space between the final lens and the substrate 40 is almost 1 mm. On the other hand, a distance h between the convex part 100a and substrate 40 or the level plate 44 corresponding to it is almost 0.4 mm. If a spray power of the air curtain is excessively strong, the liquid LW in the space disperses, and an upper limit of the spray power is restricted. However, the upper limit is inadequate to maintain the liquid LW in the space of 1 mm. Then, the distance h is made smaller than 1 mm and a deterioration of the spray power is prevented.

In the instant embodiment, the maintenance effect of the liquid LW by the air curtain is secured, even if an organic system or inorganic system material having a high refractive index is used for the liquid LW, a contamination of the inside and outside atmosphere of the exposure apparatus 1 by evaporation of the material can be prevented.

However, if the distance h is short, the convex part 100a contacts the substrate 40 when a power failure, an earthquake, a vibration, etc. occur. Then, the exposure apparatus 1 includes, in the instant embodiment, a moving mechanism 110. The moving mechanism 110 moves the convex part 100a to prevent the collision with the convex part 100a and substrate 40. The moving mechanism 110 includes, as shown in FIG. 2, a driving part 111, a measuring part 113, the electromagnetic valve 115, and a controller 117.

The driving part 111 serves to drive the convex part 110a, and is, in the instant embodiment, a tensile spring as an elastic body. The driving part 111 connects the convex part 100a to the nozzle unit 100, and a space α, which the driving part 111 is arranged, is connected to the gas supply pipe 74. Therefore, the driving part 111 can move the convex part 100a by a pressure of the gas PG supplied from the gas supply pipe 74. A pressure of the space α increases by supplying the gas PG into the space α, and the convex part 100a moves to in the substrate direction. Then, the pressure of the space α decreases by a stop of supply of the gas PG, and the convex part 100a moves in a nozzle unit direction by a power of the spring. A movement position of the convex part 100a may be restricted by a stopper formed in the convex part 100a. In a state that the convex part 100a is pulled by the spring power, the distance h between the convex part 100a and the substrate 40 is almost equal to the space between the final lens in the projection optical system 30 and the substrate 40. Since the liquid LW tend to leak in an alignment, it is necessary to move the convex part 100a closer to substrate 40 in the alignment. Of course, the convex part 100a may be moved closer to substrate 40 in a time except the alignment.

The measuring part 113 is a distance-measuring sensor that measures the distance between the final lens in the projection optical system 30 and the substrate 40, and is attached to the nozzle unit 100 or the substrate stage 45. The measuring part 113 provides a measurement result to the controller 117 described later.

The stopper 119b is a projection that projects in a horizontal direction, and restricts a lower limit of movement of the convex part 100a in the substrate direction. Therefore, a projection 124a that projects in the horizontal direction is formed in the convex part 100a.

The electromagnetic valve 115 controls the gas supply pipe 74 by an electromagnetic force generated by a control by the controller 117 described later and an electric power supplied from a power source (not shown). The electromagnetic valve 115 opens the gas supply pipe 74 in a conducting period, and closes the gas supply pipe 74 in a non-conducting period. The controller 117 described later controls the power source (not shown).

The controller 117 controls the supply of the electric power to the electromagnetic valve 115 based on the measurement result of the measuring part 113, and controls a supply of the gas PG. As a result, the controller 117 controls the movement of the convex part 100a in an optical axis direction of the projection optical system 30 by controlling the pressure of the space α.

When incorrect operation of the substrate stage 45 and incorrect operation of a damper apparatus occur, the convex part 100a and the substrate 40 abnormally approach, and this abnormal can be evaluated a decrease of flow rate of the gas PG. The collision (contact) with the convex part 100a and the substrate 40 in incorrect operation can be avoided by controlling the electromagnetic valve 115.

Thus, the exposure apparatus 1 has the distance between the convex part 100a and the substrate 40 or the level plate 44 smaller than the space between the projection optical system 30 and the substrate 40, and can maintain the liquid LW in the space. As a result, the exposure apparatus 1 can prevent a decrease of the exposure dose by the air bubbles and improve the resolution.

Moreover, since the convex part 100a is movable in the vertical direction (in the optical axis direction), the collision with the convex part 100a and the substrate 40 is prevented when the abnormal and the incorrect operation occur, and reliability can be improved.

Figure 4:
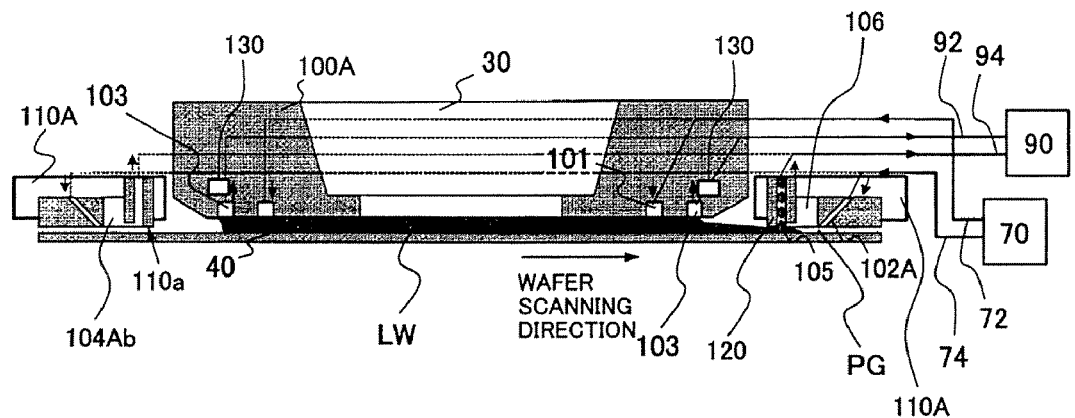
FIG. 4 is a schematic sectional view of another embodiment of the nozzle unit and a moving mechanism shown in FIG. 1.
Figure 5:
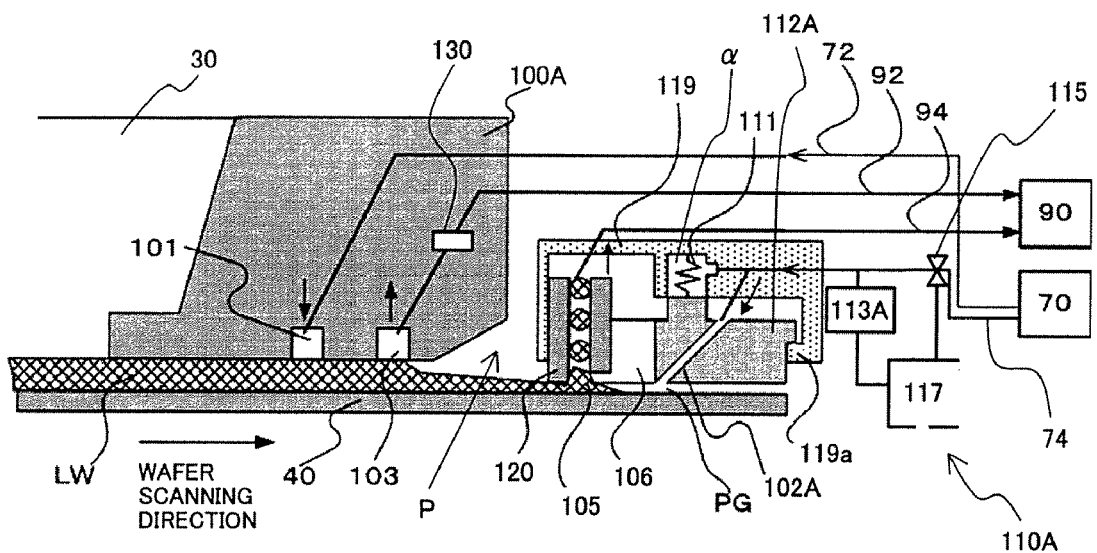
FIG. 5 is a partially enlarged sectional view of the nozzle unit and the moving mechanism shown in FIG. 4.

Referring to FIGS. 4 and 5, a description will be given of a nozzle unit 100A and a moving mechanism 110A that are another embodiment of the nozzle unit 100 and the moving mechanism 110. Here, FIG. 4 is a sectional view of the nozzle unit 100A and the moving mechanism 110A. FIG. 5 is a partially enlarged sectional view of the nozzle unit 100A and the moving mechanism 110A. The nozzle unit 100A serves to hold the final lens of the projection optical system 30. The exposure apparatus of the instant embodiment includes, as shown in FIGS. 4 and 5, the liquid supply port 101, a gas supply port 102A, the liquid recovery port 103, recovery ports 105 and 106, and a convex part 120. A function of the gas supply port 102A is substantially the same as the gas supply port 102.

The convex part 120 has a function that maintains the liquid LW in the space between the projection optical system 30 and the substrate 40. The convex part 120 separates from the nozzle unit 100A, and has the gas supply port 102A, the recovery ports 105 and 106. The convex part 120 is held by the moving mechanism 110A and is movable.

The recovery port 105 is an opening that absorbs periphery atmosphere at the top of the substrate stage 45 and recovers the liquid film leaked in the scanning direction at the movement of the substrate stage 45, and is connected to the gas recovery pipe 94. The (gas) recovery port 106 is an opening that recovers the supplied gas PG, and is connected to the outside. The supplied gas PG and evaporated liquid LW can be recovered by connecting the recovery port 106 to the gas recovery pipe (not shown). The gas recovery port 106 is arranged between the recovery port 105 and the gas supply port 102A, and serves to a channel of the gas having a cross section that is not closed with the liquid LW.

The recovery ports 105 and 106 are an opening that has a shape inserted by two concentric circles, and may be coupled with a porous member, such as a sponge, or may be a cavity. The recovery ports 105 and 106 are formed inside than the gas supply port 102A, and may have a shape inserted by two similar polygon or another shape instead of the shape inserted by two concentric circles.

If the absorption of the liquid LW from the recovery port 105 is started, the absorption amount in the recovery port 105 decrease, and the liquid LW that cannot be absorbed leaks outside. However, the liquid LW can be maintained in the space by spraying the gas PG from the gas supply port 102A arranged further outside the recovery port 105.

If the recovery port 105 is closed by the liquid LW and the recovery port 106 does not exist, a circulation of the gas PG from the gas supply port 102A to the center of the nozzle unit 100A disappears and the air curtain cannot be maintained.

When the gas PG is sprayed from the gas supply port 102A, the liquid film is ruffled and the air bubbles are generated. However, the air bubbles are recovered by the recovery port 105 with the liquid film. When a moving direction of the substrate stage 45 is reversed and the above air bubbles are not able to recover by the recovery port 105, an approach of the air bubbles generated in the outside of the liquid supply port 101 into the inside of the liquid supply port 101 can be suppressed. As a result, the movement of the liquid LW to the outside can be more difficult.

The liquid recovery port 103 simultaneously recovers the gas. Therefore, if the distance between the convex part 110 and the substrate 40 is narrow, a pressure of a liquid space increases. Thereby, the nozzle unit 100A and the substrate 40 aspirate each other, and, for example, problems, such as a lift of the substrate 40, occur. However, in the instant embodiment, a space P exists between the convex part 120 and the nozzle unit 100A, and this space P functions as a pressure venting.

When the recovery port 105 simultaneously absorbs the liquid LW and the gas PG, the vibration occurs. In the instant embodiment, the recovery port 105 separates from the nozzle unit 100A to prevent the transfer of this vibration to the projection optical system 30. If it is necessary to further suppress the vibration, the absorption from the recovery port 105 and the supply of the gas PG from the gas supply port 102A may be stopped during exposure.

The moving mechanism 110A prevents the collision with the convex part 120 and the substrate 40. The moving mechanism 110A includes, as shown in FIG. 5, the driving part 111, a measuring part 113A, the electromagnetic valve 115, the controller 117 and a housing 119. The moving mechanism 110A is different from the moving mechanism 110 in that the moving mechanism 110A includes the housing 119.

The measuring part 113A is different form the measuring part 113 in an object to be measured. The measuring part 113A measures the flow rate or the pressure of the gas PG, and is arranged in a measurable position. In addition, the measuring part 113A measures the pressure of the space α and the gas PG that flows into the space α. The measuring part 113A electrically connects to the controller 117, and informs a measurement result to the controller 117. The measuring part 113A may be a displacement sensor that measures the distance h between the convex part 120 and the substrate 40. The controller 117 controls the movement of the convex part 120. The controller 117 has the same function as the controller 117 except for using the measurement result of the measuring part 113A.

The housing 119 holds the convex part 120 so that the convex part 120 can move, separates from the nozzle unit 100A, and includes a stopper 119a. The stopper 119a is a projection that projects in a horizontal direction, and restricts a lower limit of movement of the convex part 120 in the substrate direction. Therefore, a projection 112A that projects in a horizontal direction is formed in the convex part 120.

Thus, the instant embodiment maintains the liquid LW in the space between the projection optical system 30 and the substrate 40 by the convex part 120, prevents the decrease of the exposure dose originated by the air bubbles, and can improve the throughput. Moreover, the convex part 120 can move in the vertical direction by the moving mechanism 110, and the convex part 120 can be evacuated at the abnormal and the incorrect operation. As a result, the instant embodiment prevents the collision with the convex part 120 and the substrate 40, and can provide an exposure apparatus with a high reliability.

Figure 6:
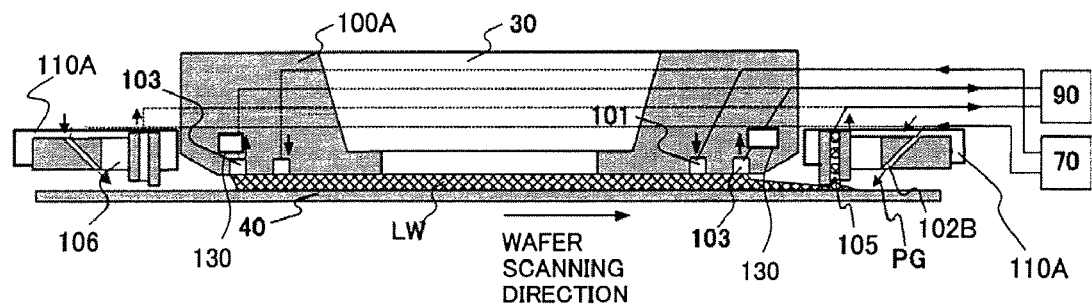
FIG. 6 is a schematic sectional view of a various example of a gas supply port shown in FIG. 4.

Although a height of the gas supply port 102A from the substrate 40 is lower than the final lens in the projection optical system 30 in FIG. 4, a height of a gas supply port 102B from the substrate 40 is higher than final lens in the projection optical system 30 as shown in FIG. 6. In FIG. 6, the ruffle of the liquid LW by the gas PG supplied from the gas supply port 102B can be suppressed by locating the recovery port 105 in the position that is lower than the gas supply port 102. Therefore, similar to the embodiment in FIG. 4, the leak of the liquid LW according to the scan of the substrate stage 45 can be suppressed. Here, FIG. 6 is a schematic sectional view of a various example of the gas supply port 102A shown in FIG. 4.

Moreover, in FIGS. 4 to 6, although a supply direction of the gas PG from the gas supply ports 102A and 102B inclines by about 45 degrees to the surface of the substrate 40, this angle is close to a perpendicular to the surface of the substrate 40. In this case, a length of a wall of the convex part 120 at the nozzle unit side in the perpendicular direction becomes long according to it.

If a contact angle of the substrate 40 or the level plate 44 is large, even two kinds of following methods can achieve the maintenance effect of the liquid LW. A first method is a method that arranges the gas supply port 102 and the recovery port 106 in a position higher than a height of the final lens in the projection optical system 30 and omits the recovery port 105. A second method is a method that omits the gas supply port 102 and the recovery port 106 from the convex part 120 and arranges only recovery port 105. In this case, if the contact angle of the substrate 40 or the level plate 44 is large, an extended distance of the liquid LW is short and the extended liquid LW is thick. Therefore, the recovery port 105 is arranged in a low position, the extended liquid LW can be recovered.

Figure 7:
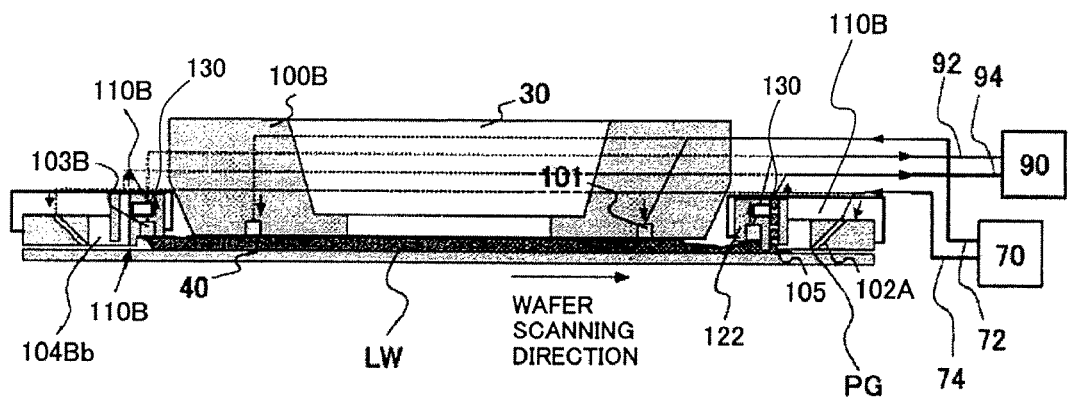
FIG. 7 is a schematic sectional view of further another embodiment of the nozzle unit and the moving mechanism shown in FIG. 1.
Figure 8:
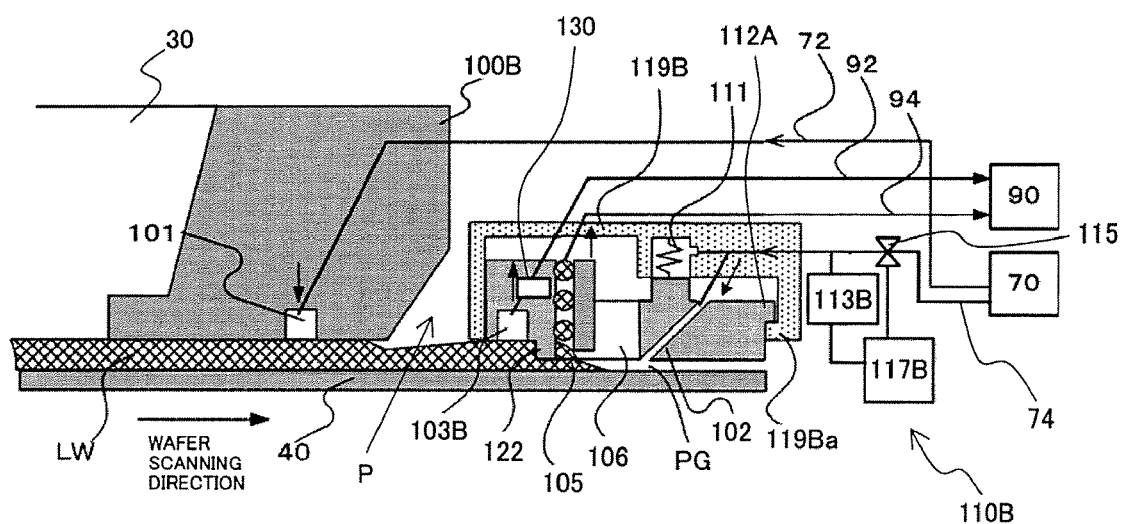
FIG. 8 is a partially enlarged sectional view of the nozzle unit and the moving mechanism shown in FIG. 7.

Referring to FIGS. 7 and 8, a description will be given of a nozzle unit 100B and a moving mechanism 110B that are another embodiment of the nozzle unit 100 and the moving mechanism 110. Here, FIG. 7 is a schematic sectional view of the nozzle unit 100B and the moving mechanism 110B. FIG. 8 is a partially enlarged sectional view of the nozzle unit 100B and the moving mechanism 110B. The nozzle unit 100B serves to hold the final lens of the projection optical system 30. The exposure apparatus of the instant embodiment includes, as shown in FIGS. 7 and 8, the liquid supply port 101, the gas supply port 102A, a liquid recovery port 103B, the recovery ports 105 and 106, and a convex part 122.

The convex part 122 serves to maintain the liquid LW in the space between the projection optical system 30 and the substrate 40, separates from the nozzle unit 100B, and includes the gas supply port 102A, and the recovery ports 105 and 106. Moreover, the convex part 122 is held by the moving part 110B so that the convex part 122 can move.

The liquid recovery port 103B has the substantially same function as the liquid recovery port 103. The liquid recovery port 103B separates from the nozzle unit 100B in the instant embodiment, and protects the projection optical system 30 from the vibration generated when the liquid recovery port 103B absorbs the liquid LW and/or the gas PG.

The liquid recovery port 103B simultaneously absorbs the gas. Therefore, if the distance between the convex part 122 and the substrate 40 is narrow, a pressure of a liquid space increases. Thereby, the nozzle unit 100B and the substrate 40 aspirate each other, and, for example, problems, such as a lift of the substrate 40, occur. However, in the instant embodiment, a space P exists between the convex part 122 and the nozzle unit 100B, and this portion functions as a pressure venting.

When the recovery port 105 simultaneously absorbs the liquid LW and the gas PG, the vibration occurs. In the instant embodiment, the recovery port 105 separates from the nozzle unit 100B to prevent the transfer of this vibration to the projection optical system 30. If it is necessary to further suppress the vibration, the absorption from the recovery port 105 and the supply of the gas PG from the gas supply port 102A may be stopped during exposure.

The moving mechanism 110B prevents the collision with the convex part 122 and the substrate 40. The moving mechanism 110B includes, as shown in FIG. 8, the driving part 111, a measuring part 113B, the electromagnetic valve 115, the controller 117 and a housing 119B. The housing 119B has the substantially same function as the housing 119.

Thus, the instant embodiment maintains the liquid LW in the space between the projection optical system 30 and the substrate 40 by the convex part 122, prevents the decrease of the exposure dose originated by the air bubbles, and can improve the throughput. Moreover, the convex part 122 can move in the vertical direction by the moving mechanism 110B, and the convex part 122 can be evacuated at the abnormal and the incorrect operation. As a result, the instant embodiment prevents the collision with the convex part 122 and the substrate 40, and can provide an exposure apparatus with a high reliability.

Figure 9:
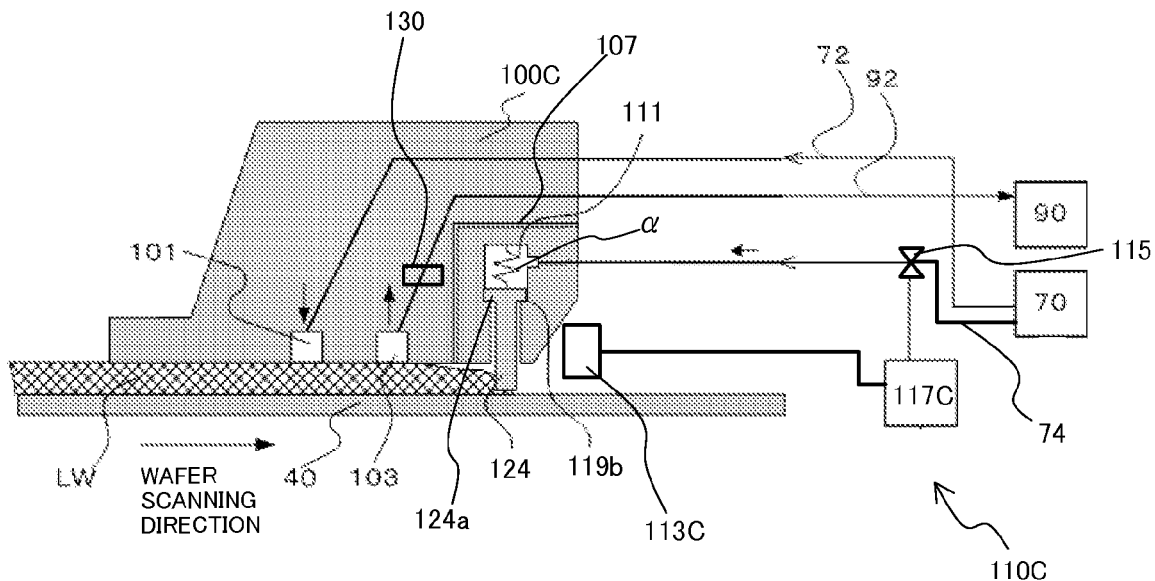
FIG. 9 is a schematic sectional view of further another embodiment of a nozzle unit and a moving mechanism shown in FIG. 1.

Referring to FIG. 9, a description will be given of a nozzle unit 100C and a moving mechanism 110C that are another embodiment of the nozzle unit 100 and the moving mechanism 110. Here, FIG. 9 is a sectional view of the nozzle unit 100C and the moving mechanism 110C. The nozzle unit 100C serves to hold the final lens of the projection optical system 30. The exposure apparatus of the instant embodiment includes, as shown in FIG. 9, the liquid supply port 101, the liquid recovery port 103, a recovery port 107, and a convex part 124. The nozzle unit 100C is different from the nozzle unit 100 in that the nozzle unit 100C includes the recovery port 107 and the convex part 124.

The convex part 124 serves to maintain the liquid LW in the space between the projection optical system 30 and the substrate 40, and is arranged in the nozzle unit 100C so that the convex part 124 projects in the substrate direction rather than the final lens in the projection optical system 30. Moreover, the convex part 124 is held by the moving part 110C so that the convex part 124 can move.

The recovery port 107 is an opening to recover the gas, and connects the space that is filled the liquid LW and the outside. The recovery port 107 absorbs both the liquid and the gas. Therefore, a pressure of a liquid filled space between the convex part 124 and the substrate 40 increases, and problems, such as a lift of the substrate 40, occur. Then, the recovery port 107 lowers the pressure of the liquid filled space.

The recovery port 107 is the opening that has a shape inserted by two concentric circles, and may be coupled with a porous member, such as a sponge, or may be a cavity. The recovery port 107 is formed outside than the liquid recovery port 103, and may have a shape inserted by two similar polygon or another shape instead of the shape inserted by two concentric circles.

The moving mechanism 110C partially combines with the nozzle unit 100C, and prevents the collision with the convex part 124 and the substrate 40. The moving mechanism 110C includes, as shown in FIG. 9, the driving part 111, a measuring part 113C, the electromagnetic valve 115, a controller 117C, and the stopper 119*b*.

The measuring part 113C is a distance-measuring sensor that measures the distance between the final lens in the projection optical system 30 and the substrate 40, and is attached to the nozzle unit 100C or the substrate stage 45. The measuring part 113C transmits the measurement result to the controller 117C described later like the measuring part 113. The controller 117C controls a movement of the convex part 124. The controller 117C has the same function as the controller 117 except using the measurement result of the measuring part 113C.

The stopper 119*b* is a projection that projects in a horizontal direction, and restricts a lower limit of movement of the convex part 124 in the substrate direction. Therefore, the projection 124*a* that projects in the horizontal direction is formed in the convex part 124. A pair of the stopper 119*b* and the projection 124 has the substantially same function as the stopper 119*b* and the projection 112A.

Thus, the instant embodiment maintains the liquid LW in the space between the projection optical system 30 and the substrate 40 by the convex part 124, prevents the decrease of the exposure dose originated by the air bubbles, and can improve the throughput. Moreover, the convex part 124 can move in the vertical direction by the moving mechanism 110C, and the convex part 124 can be evacuated at the abnormal and the incorrect operation. As a result, the instant embodiment prevents the collision with the convex part 124 and the substrate 40, and can provide an exposure apparatus with a high reliability.

Figure 10:
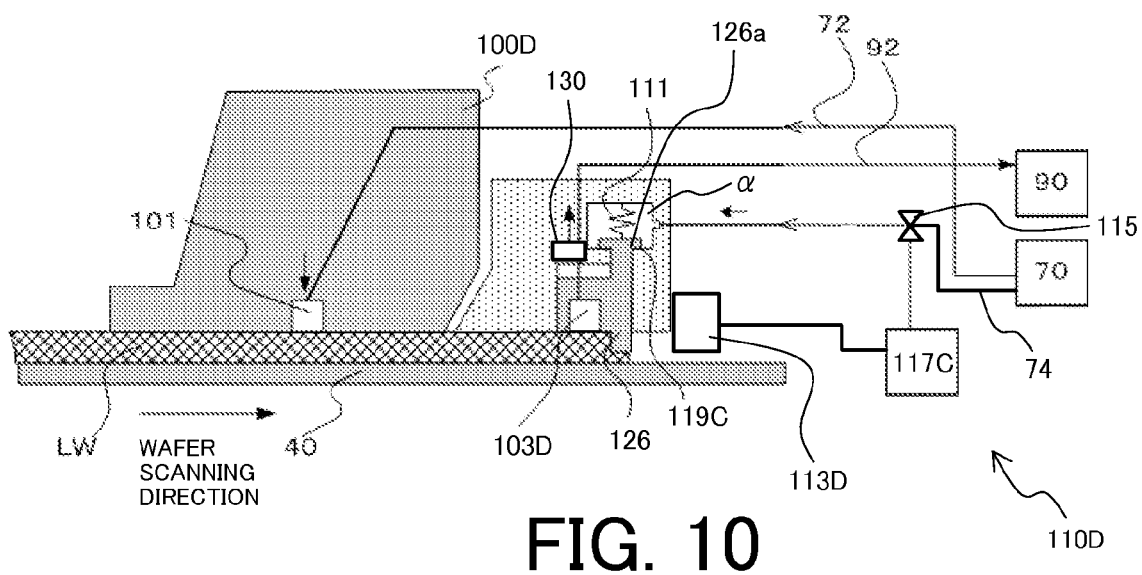
FIG. 10 is a partially enlarged sectional view of further another embodiment of a nozzle unit and a moving mechanism shown in FIG. 1.

Referring to FIG. 10, a description will be given of a nozzle unit 100D and a moving mechanism 110D that are another embodiment of the nozzle unit 100 and the moving mechanism 110. Here, FIG. 10 is a partially enlarged sectional view of the nozzle unit 100D and the moving mechanism 110D. The nozzle unit 100D serves to hold the final lens of the projection optical system 30. The exposure apparatus of the instant embodiment includes, as shown in FIG. 10, the liquid supply port 101, a liquid recovery port 103D, and a convex part 126. Although the exposure apparatus of the instant embodiment is the substantially same as the exposure apparatus shown in FIG. 8, a housing 119D is different from the housing 119B in that the housing 119D excludes an air curtain forming mechanism. In other words, the liquid recovery port 103D has the substantially same function as the liquid recovery port 103B. The convex part 126 has the substantially same function as the convex part 122, and is held by the moving mechanism 110D so that the convex part 126 can move.

The moving mechanism 110D prevents the collision with the convex part 126 and the substrate 40. The moving mechanism 110D includes, as shown in FIG. 10, the driving part 111, the measuring part 113C, the electromagnetic valve 115, the controller 117C, and the housing 119D. The housing 119D has the substantially same function as the housing 119B, and includes a stopper 119*c*. Moreover, the convex part 126 includes a projection 126*a*. A pair of the stopper 119*c* and the projection 126*a* has the substantially same function as the stopper 119*a* and the projection 112A.

Thus, the instant embodiment maintains the liquid LW in the space between the projection optical system 30 and the substrate 40 by the convex part 126, prevents the decrease of the exposure dose originated by the air bubbles, and can improve the throughput. Moreover, the convex part 126 can move in the vertical direction by the moving mechanism 110, and the convex part 126 can be evacuated at the abnormal and the incorrect operation. As a result, the instant embodiment prevents the collision with the convex part 126 and the substrate 40, and can provide an exposure apparatus with a high reliability.

In exposure, the illumination optical system 14 e.g., Koehler-illuminates the reticle 20 using the light emitted from the light source unit 12. The light that passes the reticle 20 and reflects the reticle pattern is imaged on the substrate 40 by the projection optical system 30 and the liquid LW. The exposure apparatus 1 can achieve the high-resolution exposure, and can maintain the liquid LW in the space between the projection optical system 30 and the substrate 40 by the convex part 100*a*, and 120 to 126 (hereinafter, "reference number 100*a*"). As a result, the exposure apparatus 1 can prevent the decrease of exposure dose by mixture of the air bubbles, and improve the throughput. Moreover, the convex part 100*a* can move in the vertical direction by the moving mechanisms 110 to 110D (hereinafter, "reference number 110"), the convex part 100*a* can be evacuated at the abnormal and the incorrect operation. As a result, the instant embodiment prevents the collision with the convex part 100*a* and the substrate 40, and can provide an exposure apparatus with a high reliability.

Figure 11:
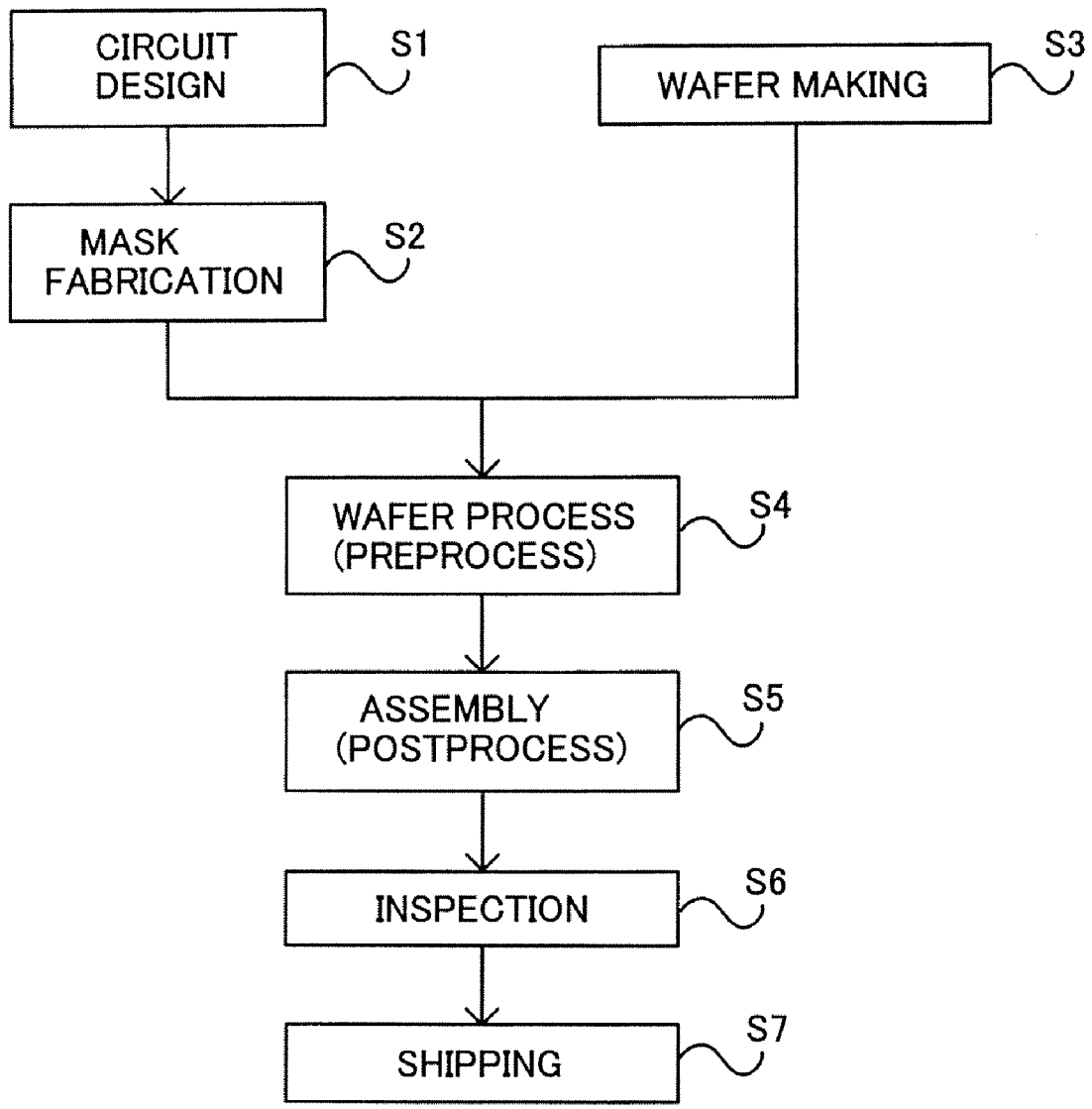
FIG. 11 is a flowchart for explaining a method for fabricating devices.
Figure 12:
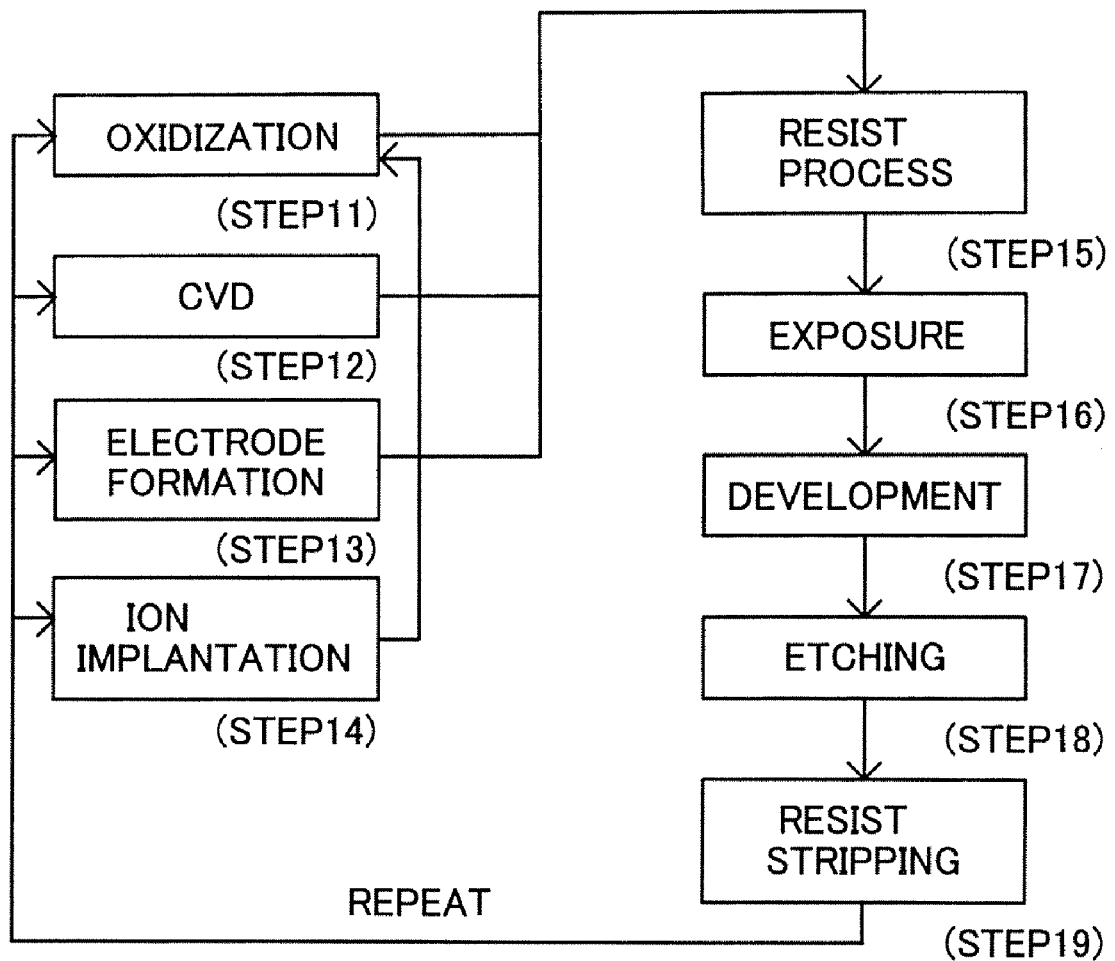
FIG. 12 is a detail flowchart of a wafer process in Step 4 of FIG. 11.

Referring now to FIGS. 11 and 12, a description will be given of an embodiment of a device fabrication method using the above mentioned exposure apparatus 1. FIG. 11 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 12 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 1, and resultant devices constitute one aspect of the present invention.

Furthermore, the present invention is not limited to these preferred embodiments and various variations and modifications may be made without departing from the scope of the present invention.

This application claims a foreign priority benefit based on Japanese Patent Application No. 2005-284441, filed on Sep. 29, 2005, which is hereby incorporated by reference herein in its entirety as if fully set forth herein.

What is claimed is:

1. An exposure apparatus that includes a projection optical system for exposing a substrate to light incident thereto via a reticle, and via a liquid that is filled in a space between the substrate and a final lens surface of the projection optical system, the apparatus comprising:
   a nozzle unit configured to fill the space with the liquid;
   a convex part held by the nozzle unit and movable toward and away from the substrate relative to the nozzle unit for containing the filled liquid in the space; and
   a driving mechanism configured to move the convex part to make an interval between the convex part and the substrate smaller than an interval between the nozzle unit and the substrate so that the convex part contains the filled liquid in the space.

2. An exposure apparatus according to claim 1, further comprising:
   a gas supply port configured to supply gas toward the substrate to restrict dispersing of the filled liquid from the space,
   wherein the driving mechanism is configured to move the convex part with a pressure of the gas.

3. An exposure apparatus according to claim 2, wherein the driving mechanism further includes:
   a measuring device configured to measure a pressure or a flow rate of the gas; and
   a controller configured to control a movement of the convex part with the driving mechanism based on an output of the measuring device.

4. An exposure apparatus according to claim 1, wherein the driving mechanism includes:
   a measuring device configured to measure a distance between the convex part and the substrate or a member that is adjacent to the substrate; and
   a controller configured to control a movement of the convex part with the driving mechanism based on a measurement result of the measuring device.

5. An exposure apparatus according to claim 1, wherein the driving mechanism includes a stopper configured to restrict a movement of the convex part in a direction toward the substrate or a stage holding the substrate.

6. An exposure apparatus according to claim 1, wherein the nozzle unit includes a recovery port configured to recover the liquid from the space.

7. An exposure apparatus according to claim 1, wherein the nozzle unit includes a first nozzle unit and a second nozzle unit outside of the first nozzle unit, and the second nozzle unit holds the convex part.

8. An exposure apparatus according to claim 7, further comprising a vent between the first nozzle unit and the second nozzle unit.

9. A device fabrication method comprising the steps of:
   exposing a substrate to be exposed using the exposure apparatus according to claim 1; and
   performing a development process for the exposed substrate.

* * * * *